United States Patent [19]
Clecak et al.

[11] Patent Number: 5,322,765
[45] Date of Patent: Jun. 21, 1994

[54] DRY DEVELOPABLE PHOTORESIST COMPOSITIONS AND METHOD FOR USE THEREOF

[75] Inventors: Nicholas J. Clecak, San Jose, Calif.; Willard E. Conley, Cornwall, N.Y.; Ranee W.-L. Kwong, Wappings Falls, N.Y.; Leo L. Linehan, Walden, N.Y.; Scott A. MacDonald, San Jose, Calif.; Harbans S. Sachdev, Hopewell Junction, N.Y.; Hubert Schlosser, Glashutten, Fed. Rep. of Germany; Carlton G. Willson, San Jose, Calif.

[73] Assignee: International Business Machines Corporation, Armonk, N.Y.

[21] Appl. No.: 796,527

[22] Filed: Nov. 22, 1991

[51] Int. Cl.$^5$ .......................... G03C 1/72; G03F 7/00
[52] U.S. Cl. .................................. 430/326; 430/270; 430/313
[58] Field of Search ............... 430/326, 270, 281, 313

[56] References Cited

U.S. PATENT DOCUMENTS

| | | | |
|---|---|---|---|
| 4,371,605 | 2/1983 | Renner | 430/280 |
| 4,404,272 | 9/1983 | Stahlhofan | 430/192 |
| 4,613,398 | 9/1986 | Chiong et al. | 156/628 |
| 4,810,601 | 3/1989 | Allen et al. | 430/18 |
| 4,863,827 | 9/1989 | Jain et al. | 430/145 |
| 4,939,070 | 7/1990 | Brunsvold et al. | 430/312 |
| 5,079,131 | 1/1992 | Thakeray et al. | 430/326 |

FOREIGN PATENT DOCUMENTS

| | | | |
|---|---|---|---|
| 204253A | 5/1986 | European Pat. Off. | G03F 7/26 |
| 281182 | 9/1988 | European Pat. Off. | G03F 7/26 |
| 282724 | 9/1988 | European Pat. Off. | G03F 7/10 |
| 388343A | 9/1990 | European Pat. Off. | G03F 7/039 |

OTHER PUBLICATIONS

Reck et al., *SPIE Regional Technical Conference on Photopolymers* Ellenville, NY 63 (1988), "Novel Photoresist Design Based on Electrophilic Aromatic Substitution."

Schellekens et al.; *Proc SPIE* 1086, 220 (1989); "Single Level Dry Developable Resist Systems, Based on Gas Phase Silylation".

Primary Examiner—Marion E. McCamish
Assistant Examiner—Rosemary Ashton
Attorney, Agent, or Firm—John A. Stemwedel; Dale M. Crockatt

[57] ABSTRACT

Dry developable top surface imageable photoresist compositions which comprise, in admixture, a film-forming aromatic polymer resin activated to electrophilic substitution, an acid catalyzable agent capable of being inserted into the aromatic polymer resin, and a radiation degradable acid generating compound and processes for generating positive tone resist images on substrates therewith.

23 Claims, 7 Drawing Sheets

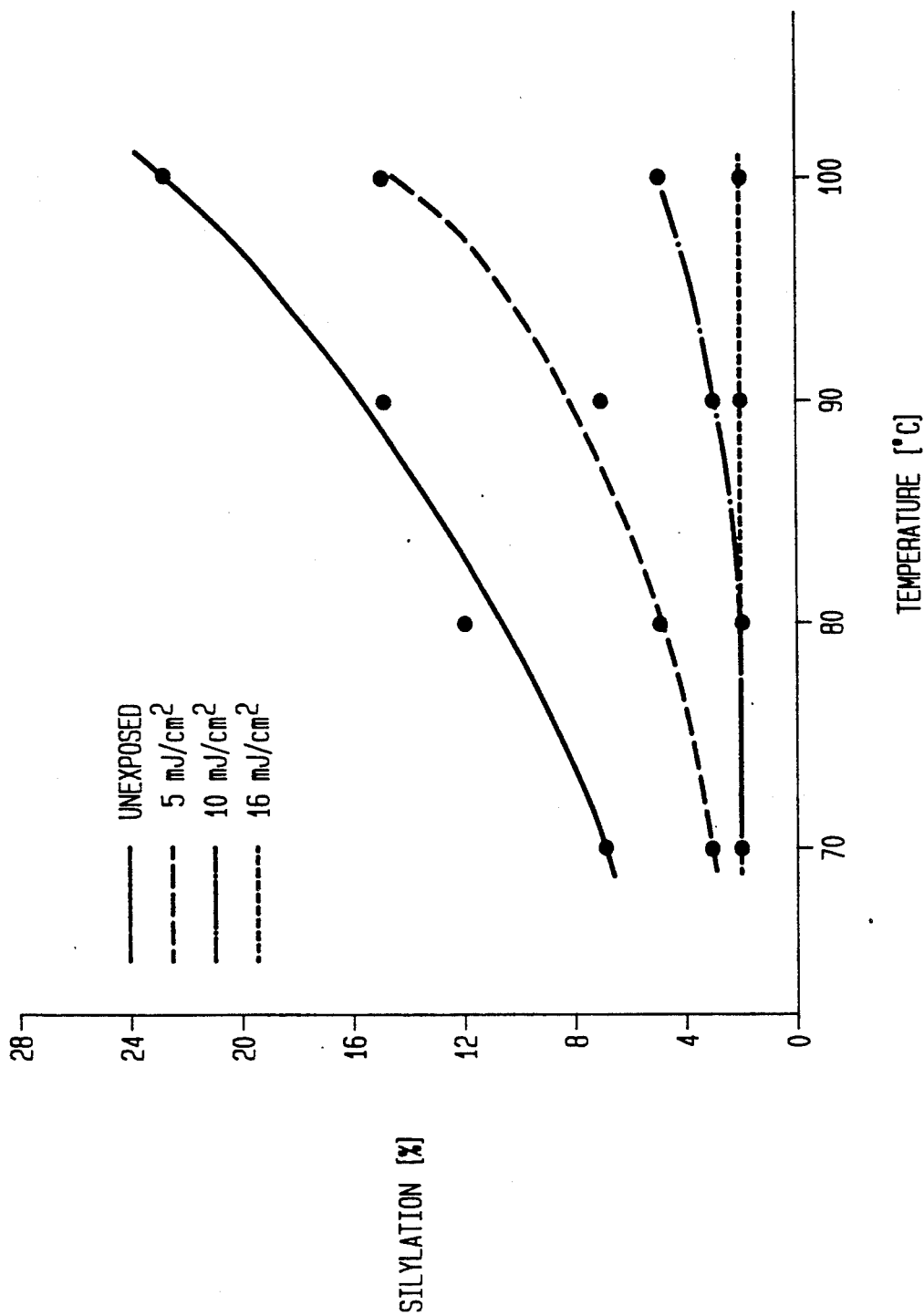

DRY DEVELOPABLE PHOTORESIST COMPOSITIONS AND METHOD FOR USE THEREOF

FIELD OF INVENTION

The present invention relates to processes for forming lithographic patterns with dry-developable, top surface imageable photoresist compositions.

BACKGROUND OF THE INVENTION

There has been a continuing desire in the electronics industry to obtain higher circuit density in microelectronic devices. To achieve the higher degree of integration necessary to meet the ground rules for such devices, lithographic techniques have been subjected to improvements which enhance the resolution of lithographic patterns in photoresist films.

Aqueous base developable photoresist compositions which crosslink through electrophilic aromatic substitution have been disclosed in Reck et al., *SPIE Regional Technical Conference on Photopolymers*, Ellenville, N.Y., 63 (1988). Such formulations are characterized by having 3 structural components which include (a) an aromatic moiety, such as poly(4-hydroxystyrene) or novolak, which is susceptible to electrophilic aromatic substitution and allows for development under ionizing conditions, (b) a stable substance which is capable upon reaction with acid, of generating an electrophile, viz., a carbocationic species whose precursor is the acetate of an aryl methylol, and (c) a photo-acid generator which is an onium salt such as triphenylsulfonium hexafluoroantimonate. Upon exposure latent images are formed consisting of a strong acid dispersed in the exposed areas of the resist film. When the film is baked briefly after exposure, the acid cleaves the acetate group of the latent electrophile to produce a benzylic carbocationic species which reacts immediately with the surrounding phenolic resin to form new carbon-carbon bonds. Such formation of new carbon-carbon bonds results in an increase in molecular weight of the resin or its crosslinking, thereby drastically altering its solubility properties. Subsequent development in dilute base affords a negative-tone image of the mask. (Systems which included novolak resins were said to exhibit an unacceptable high optical density in deep UV).

In Schellekens et al., *Proc. SPIE* 1086, 220 (1989), single layer resist systems are provided that involve the gas phase silylation and dry development& of diazoquinone novolak resists and poly(vinylphenol) resists in the novolak case a novolak identified as AZ-Protective Coating was used and 2,6-bis(hydroxymethyl)-4-t-butyl-1-hydroxybenzene was used as a crosslinking agent and diphenyliodonium hexafluorophosphate was used as the deep UV sensitizer. In the case of the poly(vinylphenols), hexamethoxymethylmelamine was used as the crosslinker and 2(4-phenylphenyl)-4,6-bis(trichlorolmethyl)-s-triazine was used as the sensitizer. In contrast to previously known esterification crosslinking schemes, the authors of this paper took as the position that the crosslinking both in the case of the novolak species and in the case of the poly(vinylphenols) occurs due to a transetherification mechanism. The crosslinking sites are the hydroxy groups on the polymer chain. This paper further discloses the silylation of the resists using both hexamethyl disilazane and trimethylsilyl-dimethylamine as silylating agents.

U.S. Pat. No. 4,613,398 to Chiong et al. is directed to methods for formation of etch resistant resists through the preferential permeation of organometallic materials into the differentially exposed polymeric resist materials. In certain embodiments, the differential permeation is achieved through the crosslinking of the polymer molecules to increase the molecular weight of the polymer and reduce its permeability. Typical of the photocrosslinkable polymers are those which contain functional groups such as hydroxy, carbonyl, phenol, amine and imide NH. These polymers include novolak resins, resoles, epoxides, and polymers containing azido groups and polyviynylphenol additionally crosslinking maybe through polyfunctional monomers and prepolymers containing double bonds and epoxy groups.

U.S. Pat. No. 4,810,601 to Allen et al. is concerned with the formation of top surface images in resist films that transfers the image to only the top surface of the film so that the subsequent treatment with organometallic reagent occurs only in the top fraction of the film which is more permeable or more reactive to the organometallic reagent giving a structure which is equivalent to a bi or multilayer system. That disclosure is directed primarily to those materials which have recurrent acid labile pendent groups that when released from the polymer chain provide sights for reaction with the organometallic material.

U.S. patent application Ser. No. 07/735,420, filed Jul. 25, 1991 to Allen et al., is directed to methods for converting chemically amplified photoresist systems to a top surface imaging resist system by the incorporation of an opaquing dye in the photoresist composition to prevent the passage of imaging radiation through a substantial portion of the film and treating the imaged film with a silylating agent and dry developing such treated film to form negative tone resist images.

SUMMARY OF THE INVENTION

The present invention relates to processes for generating positive tone resist images on a substrate comprising the steps of:

(a) coating the substrate with a film comprising (i) a film-forming aromatic polymer resin having functional groups which activate said resin to stabilize said resin to electrophilic aromatic substitution, (ii) an acid catalyzable crosslinking agent which forms a carbonium ion upon reaction with acid, and (iii) a radiation degradable acid generator which is adapted to absorb imaging radiation, such that, upon crosslinking, said composition is more highly densified and us less permeable to the absorption of an organometallic reagent in the crosslinked regions than it is in the non-crosslinked regions;

(b) imagewise exposing of the film to mid or deep UV radiation to cause densification of the resin in the exposed portion of the film;

(c) contacting said film with an organometallic reagent to absorb the organometallic agent in such more permeable unexposed areas; and, (d) etching the film with reactive ions to yield a positive resist pattern.

In the preferred embodiment of the invention the carbonium ion formed is a benzyl carbonium ion.

In an alternative embodiment of the present invention, an aromatic dye may be included in the composition.

A more thorough disclosure of the present invention is presented in the detailed description which follows and in the accompanying drawings.

BRIEF DESCRIPTION OF THE DRAWINGS

FIG. 1 are photomicrographs showing images made by the process of the invention.

FIG. 3 is a plot showing percent silylation as a function of process terperature.

FIG. 4 is a comparison of image degradation as a function of silylation terperature.

FIG. 6 shows deep UV imaging of a photoresist using monomeric crosslinking agents.

FIG. 7 shows i-line imaging of a photoresist using monomeric crosslinking agents.

DETAILED DESCRIPTION OF THE INVENTION

Figure 1A:
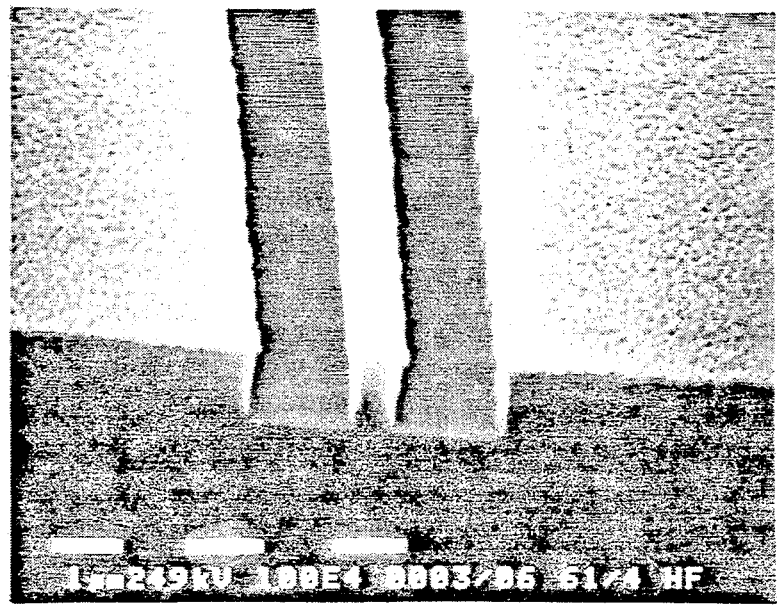
FIG. 1A shows images made by the process of the invention and after a brief dip in hydrofluoric acid solution.

The present invention relates to processes for generating positive tone resist images on a substrate comprising the steps of:

(a) coating the substrate with a film comprising (i) a film-forming aromatic polymer resin having functional groups which activate said resin to electrophilic aromatic substitution, (ii) an acid catalyzable crosslinking agent which forms a carbonium ion upon reaction with acid, and (iii) a radiation degradable acid generator which is adapted to absorb imaging radiation, such that, upon crosslinking, said composition is more highly densified and is less permeable to the absorption of an organometallic reagent in the crosslinked regions than it is in the non-crosslinked regions;

(b) imagewise exposing of the film to mid or deep UV radiation to cause crosslinking of the resin in the exposed portion of the film;

(c) contacting said film with an organometallic reagent to absorb the organometallic agent in such more permeable unexposed areas; and, (d) etching the film with reactive ions to yield a positive resist pattern.

In the first step of the process of the present invention, a suitable substrate such as silicon, silicon oxide, silicon nitride or galium arsenide is coated with a film comprising the resist composition which is dissolved in a suitable organic solvent.

The aromatic polymer resin has functional groups which are preferably phenolic hydroxy groups, which activate the aromatic ring to electrophilic aromatic substitution. Typically such aromatic polymer resins will be activated ring systems such as polyhydroxystyrene or novolak resins. These materials include copolymers thereof and should be considered to comprise poly(hydroxystyrene), poly(hydroxystyrene-co-t-butyloxycarbonyloxystyrene), poly(hydroxystyrene-co-hydroxymethylstyrene), poly(hydroxystyrene-co-acetoxymethylstyrene) alkyl substituted polyvinyl phenols and novolak resins such as cresol novolak, ethylphenol novolaks, xylenol novolaks, etc.

The acid catalyzable crosslinking agent is carbonium ion precursor. The preferred carbonium ions are benzylic carbonium ions, that is, phenyl methyl in form, and more than one carbonium ion site may be present on the precursor. Typical functional groups which react with acid to form carbonium ions are acetate groups on benzyl acetate type structures. The aromatic ring may be part of a polymer chain and be monomeric and may contain substituents which promote the formation and stabilization of the carbonium ion. The substituents must however be compatible with the imaging and stability characteristics of the final resist formulation. Preferred substituents include hydroxy (—OH), lower alkyl (preferably —CH$_3$), and substituted lower alkyl (preferably —CH$_2$OAc, where OAc is acetate).

The crosslinking agents include poly-functional aromatic polymers which react with acid to form benzyl carbonium ions. The polymers need not have functional precursor groups on each aromatic ring. The preferred polymer structures are poly acetoxymethylstyrene and copolymers thereof. The most preferred copolymers are poly(acetoxymethylstyrene-co-hydroxystyrene) polymers. Para orientation is preferred and the ratio of hydroxystyrene to acetoxymethyl styrene is 4 to 1.

The useful monomeric crosslinking agents are of the form of diacetoxymethyl phenolic monomers. It has been found that having the acetoxymethyl groups in the ortho position with respect to a phenolic hydroxy group promotes stabilized carbonium ions. The preferred monomeric carbonium ion precursors include 2,6-diacetoxymethyl-p-cresol, 2,6-diacetoxymethylphenol, 2,2',6,6'-tetracetoxy methyl-Bisphenol A and trisacetoxy mestylene.

Suitable photoacid generators for use in the present invention include radiation degradable acid generators (sometimes known as photoacids). These photoacids include metallic and non-metallic onium salts and non-metallic sulfonic acid precursors which generate strong acids upon exposure to radiation. Typical of the onium salts are diaryliodonium and triarylsulfonium salts. These photoacids may include diphenyliodonium hexafluoroarsenate, di(t-butylphenyl)iodonium hexafluoroarsenate, diphenyliodonium hexafluoroantimonate, di(t-butylphenyl)iodonium hexafluoroantimonate, diphenyliodonium triflate, di(t-butylphenyl)iodonium triflate, triphenylsulfonium hexafluoroantimonate, tri(t-butylphenyl)sulfonium hexafluoroantimonate, triphenylsulfonium hexafluoroarsinate, tri(t-butylphenyl)sulfoninium hexafluoroasenate, triphenylsulfonium hexafluorophosphate, tri(t-butylphenyl)sulfonium hexafluorophosphate, triphenylsulfonium triflate and tri(t-butylphenyl) sulfonium triflate.

Among the non-metallic sulfonic acid precursors which generate strong acids upon exposure to radiation are N-sulfonyloxyimides of the form

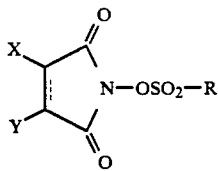

where R is selected from the group consisting of —CF$_3$, —CF$_2$CF$_3$, —CF$_2$CF$_2$H, —(CF$_2$)$_n$—Z where n=1 to 4, where Z is H, alkyl, aryl,

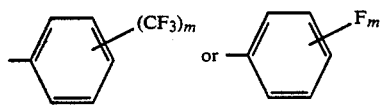

where m=1 to 5, where X any Y either (1) form a cyclic or polycyclic ring which may contain one or more hetero atoms, (2) form a fused aromatic ring, (3) may be independently H, alkyl or aryl, (4) may be attached to another sulfonyloxyimide-containing residue, or (5) may be attached to a polymeric chain or backbone.

The film may also comprise an aromatic dye which functions to absorb substantially all imaging mid and deep UV radiation incident on the film during the process before it reaches the substrate. The imaging mid and deep UV radiation used to process the present invention preferably has a wave length of from about 200 to about 370 nm. Suitable dyes include phenoxymethyl anthracene, anthracenemethanol, 9,10-diphenylanthracene, and phenanthracene and biphenyl derivatives.

In the second step of the process of the present invention, the film is imagewise exposed to mid or deep UV radiation to densify the aromatic polymer in the exposed region of the film. Suitable radiation sources include various arc lamps as mercury, deuterium or excimer laser source.

In the third step of the process of the present invention, the film is contacted with an organometallic agent in liquid or gas phase. The preferred metallic portions of the organometallic agent comprise silicon, tin, germanium and titanium. Preferred organometallic compounds are organosilicon and organostannyl compounds including, for example dimethylaminotrimethylsilane, hexamethyldisilazane, trimethylsilylchloride, trimethylstannylchloride and 1,1,3,3,5,5-hexamethylcyclotrisilazane. Other organometallic agents will be known to those skilled in the art.

The un-crosslinked portions of the resists film absorb the organometallic compound to provide the film with resistance to O$_2$ reactive ion etching.

The final step of the process of the present invention involves reactive ion etching of the film to yield positive tone dry-developed images etching techniques and etching agents and equipment are well known in the art. In the present invention it is preferred that the etching plasma be an O$_2$ plasma.

The following examples are detailed descriptions of methods of preparation and use of the process of the present invention. The detailed preparations fall within the scope of, and serve to exemplify, the more generally described methods set forth above. The examples are presented for illustrative purposes only, and are not intended to restrict or limit the scope of the invention.

EXAMPLE 1

Figure 1B:
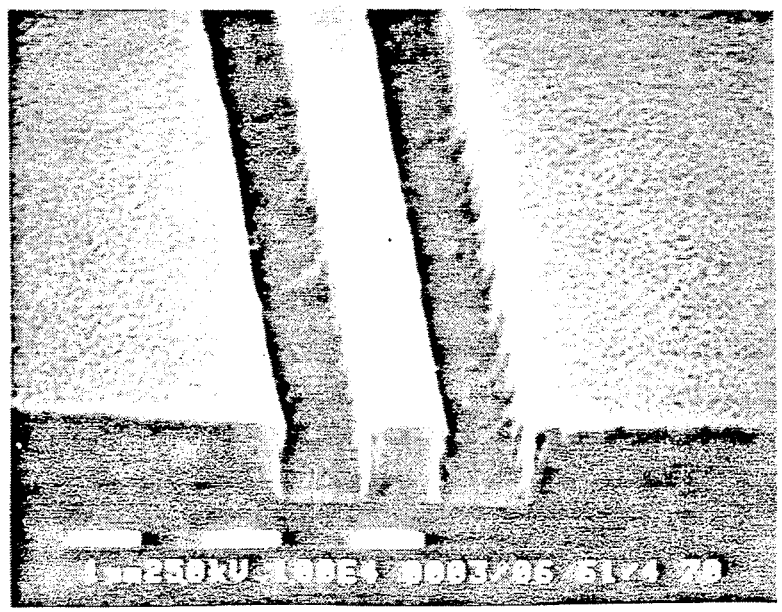
FIG. 1B shows images made by the process of the invention before a brief dip in hydrofluoric acid solution.

2.0 g of poly (p-hydroxystrene-co-p-acetoxymethylstyrene) having approximately 8 p-hydroxystyrene groups to 2 p-acetoxymethylstyrene groups and 0.10 g of triphenylsulfonium hexfluoroarsenate were formulated as a photoresist having 18 weight % of solids in propylene glycol monomethyl ether acetate (PMA). This photoresist mixture was spin coated at 4,000 rpm onto silicon wafers to form a coating 1.0 μm thick and the coated wafers were baked at 90° C. for four minutes on a hot plate. The coated wafers were exposed to 16 mJ/cm$^2$ of deep UV radiation using a Perkin-Elmer Micraline 500 operating in the UV-2 mode. The exposed wafers were baked on a hotplate for 3 minutes at 120° C. The exposed wafers were then silylated for 5 minutes at 70° C. using 200 Torr of dimethylaminotrimethylsilane. The silylated wafers were transferred to a Plasma-Therm parallel plate reactive ion etch tool for O$_2$ plasma development of the relief image. The etching conditions were as follows: 150 watts RF power, 40 SCCM O$_2$, 20 mTorr and etch time of 30 minutes. The relief image generated in this Example is shown in FIG. 1.

Figure 2:
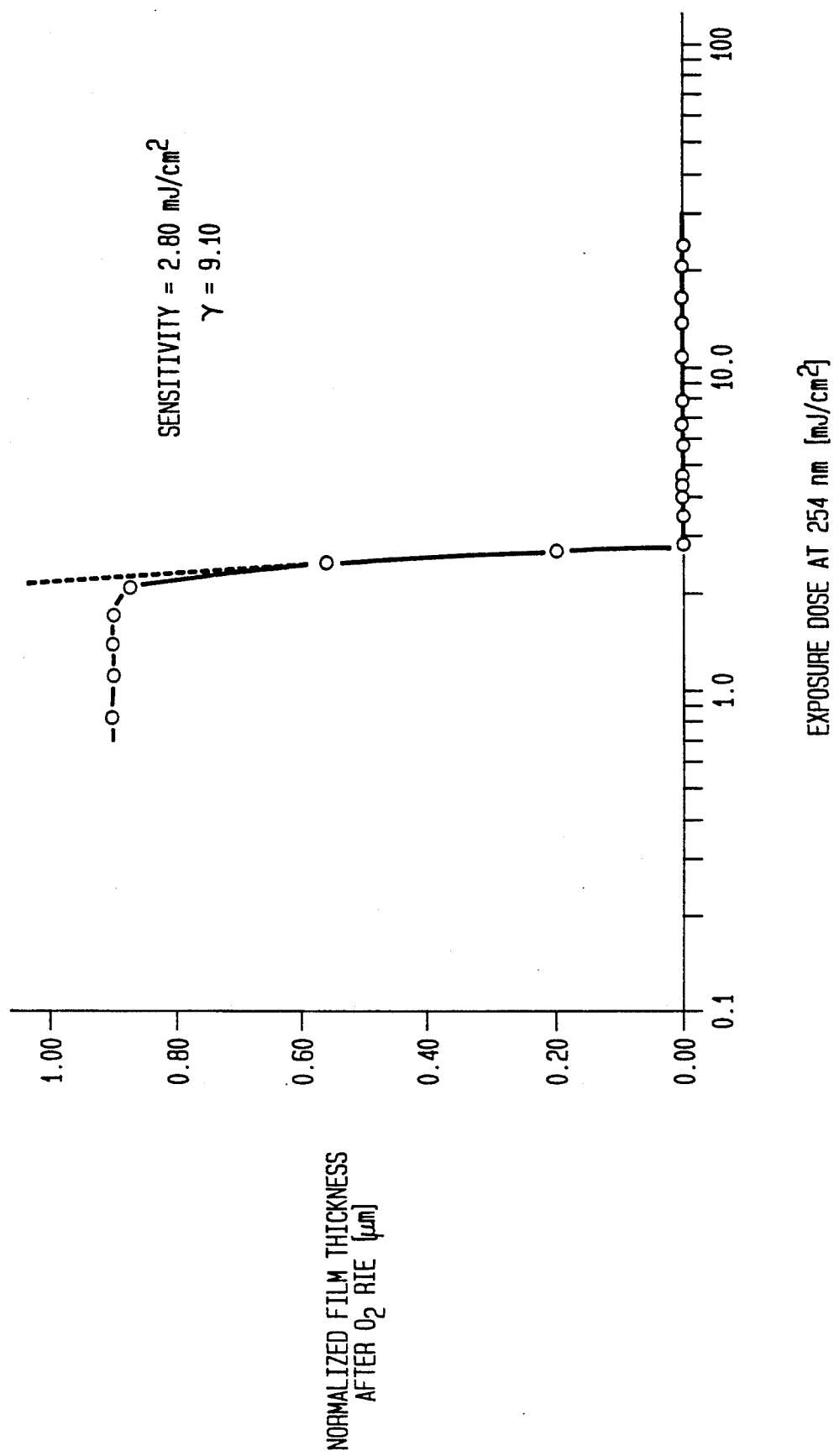
FIG. 2 is a plot of sensitivity and contrast using the process of the invention.

The sensitivity and contrast of this formulation at 254 nm were determined to be approximately 3 mJ/cm$^2$ and 9 respectively as are show in FIG. 2.

EXAMPLE 2

The amount of silicon incorporated into a resist film is strongly influenced by the silylation temperature. This was studied by using IR spectroscopy to measure silicon uptake as a function of silylation temperature and exposure dose. In this Example the resist formulation of Example 1 was spin coated onto NaCl substrates and baked. The coated substrates were divided into four sets, the 1st set was exposed to 5 mJ/cm$^2$, the 2nd set was exposed to 10 mJ/cm$^2$, the 3rd set was exposed to 16 mJ/cm$^2$, and the 4th set was unexposed. The wafers were baked at 120° C. for 4 minutes and were silylated with dimethylaminotrimethylsilane for 5 minutes at 200 Torr at various reaction temperatures. FIG. 3 provides plots showing that the percent silylation (as determined by IR spectroscopy) increases with temperature and decreases with UV exposure dose.

EXAMPLE 3

Figure 4A:
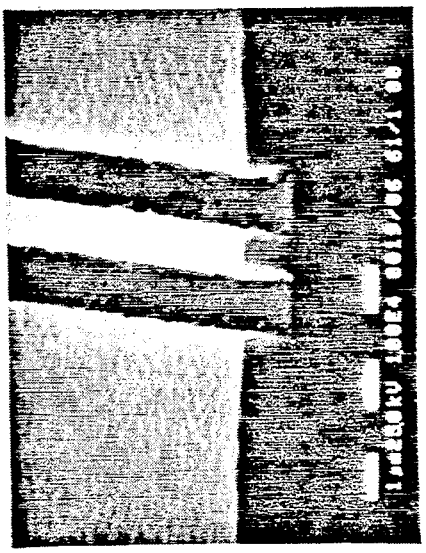
FIG. 4A is a photo micrograph showing images silylated at a temperature of 70 degrees C.
Figure 4B:
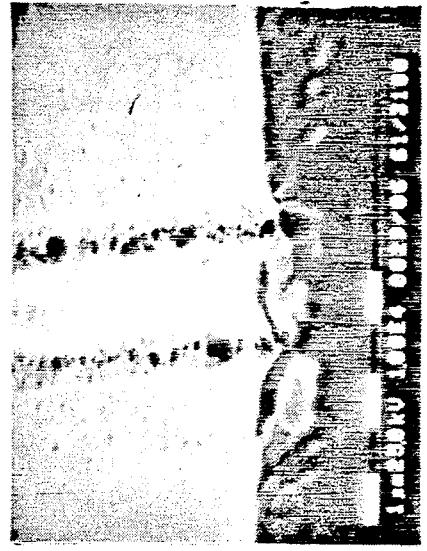
FIG. 4B is a photo micrograph showing images silylated at a temperature of 80 degrees C.
Figure 4C:
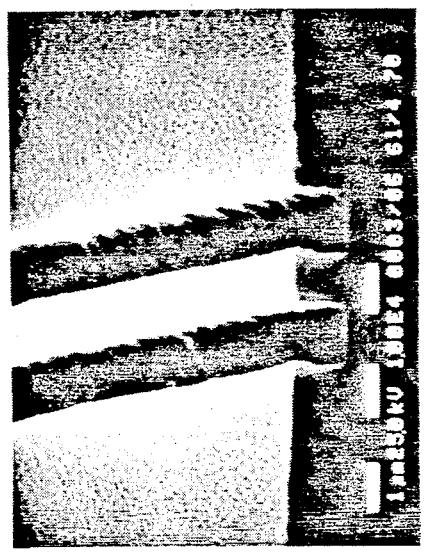
FIG. 4C is a photo micrograph showing images silylated at a temperature of 90 degrees C.
Figure 4D:
FIG. 4D is a photo micrograph showing images silylated at a temperature of 100 degrees C.

This Example shows the influences that silylation temperature has on the quality of the developed relief image. In this study the formulation was coated onto 5 inch silicon wafers and was processed as described above in Example(s) 1 and 2. The process conditions were held constant except for changes in the silylation temperature which was varied from 70 (FIG. 4A) to 100° C. (FIG. 4D). As may be seen from FIG. 4, the higher the temperature during silylation, the greater the degradation of the quality of the relief image.

EXAMPLE 4

Figure 5:
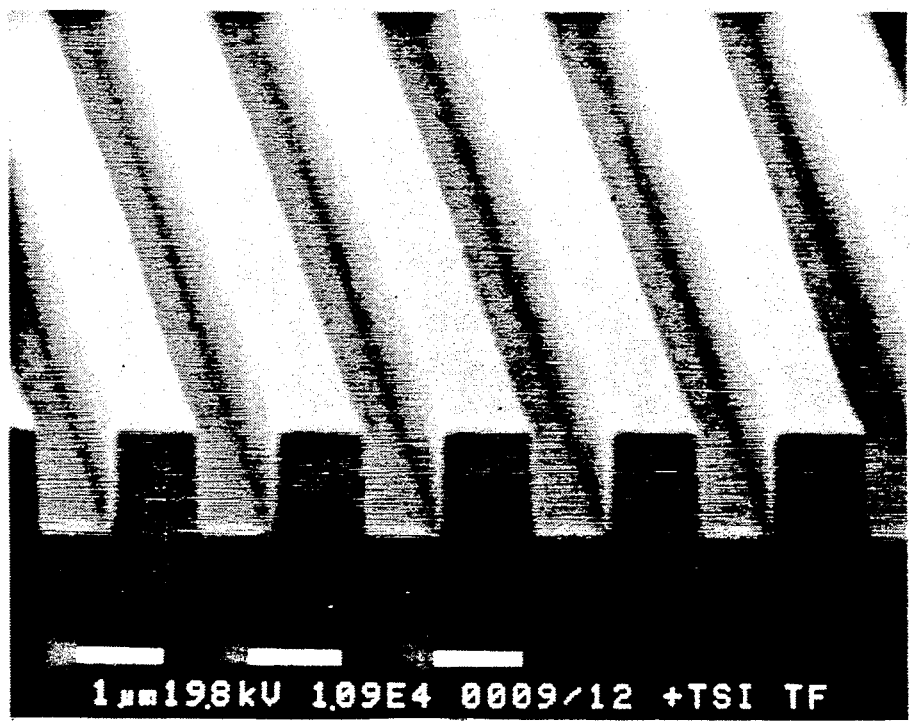
FIG. 5 shows an image profile made using a dyed photoresist.

A top surface imageable resists was prepared by adding 9-phenoxymethylanthracene, an opaquing agent, to the resist composition of Example 1. The composition of the system was as follows: 17% (wt/wt) poly(p-hydroxystyrene-co-p-acetoxymethylstyrene), 0.9% (wt/wt) 9-phenoxymethylanthracene, 0.9% (wt/wt) triphenylsulfonium trifluoromethylsulfonate, and 81.2% (wt/wt) propylene glycol monomethyl ether acetate (PMA). This photoresist composition was spin coated at 3000 rpm onto silicon wafers to form a coating 0.8 μm thick. The coated wafers were baked at 90° C. for 1 minute and were then exposed with 3.5 mJ/cm² of deep UV light using a 1X Ultratech step-and-repeat tool (model X-248E) operating at 248 nm with a 7 nm wide band pass filter. The exposed wafers were then silylated for 2 minutes at 70° C. using 200 Torr of dimethylaminotrimethylsilane in a MONARCH single wafer silylation tool. The silylated wafers were transferred to a Materials Research Corporation magnetically enhanced plasma etch tool (model #MIE 710). The etching conditions were as follows: 1 kW RF power, 10 SCCM O₂, 1.0 mTorr, and an etch time of 1.2 minutes. The wafer was rinsed with 6:1 buffered HF, followed by water to remove a small amount of substrate residue. FIG. 5 shows the relief image generated in this process.

EXAMPLE 5

Preparation of 2,6-diacetoxymethyl-*p*-cresol was accomplished in a quantitative manner by reaction of *p*-cresol with 2 equivalents of formaldehyde to form di-2,6-hydroxymethyl *p*-cresol which was further treated with acetic anhydride and sulfuric acid in acetic acid to form the diacetate(diester).

Figure 6A:
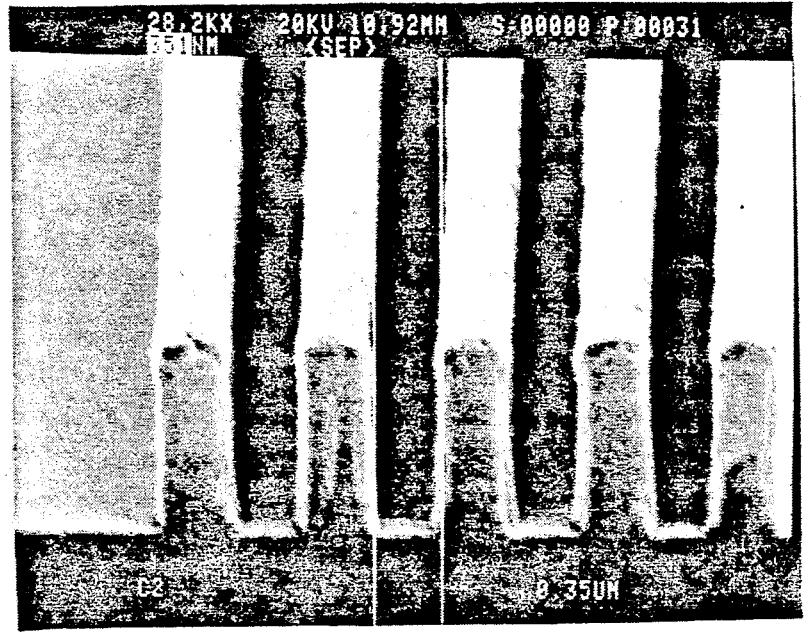
FIG. 6A is a photo micrograph showing 0.35 micrometer images.
Figure 6B:
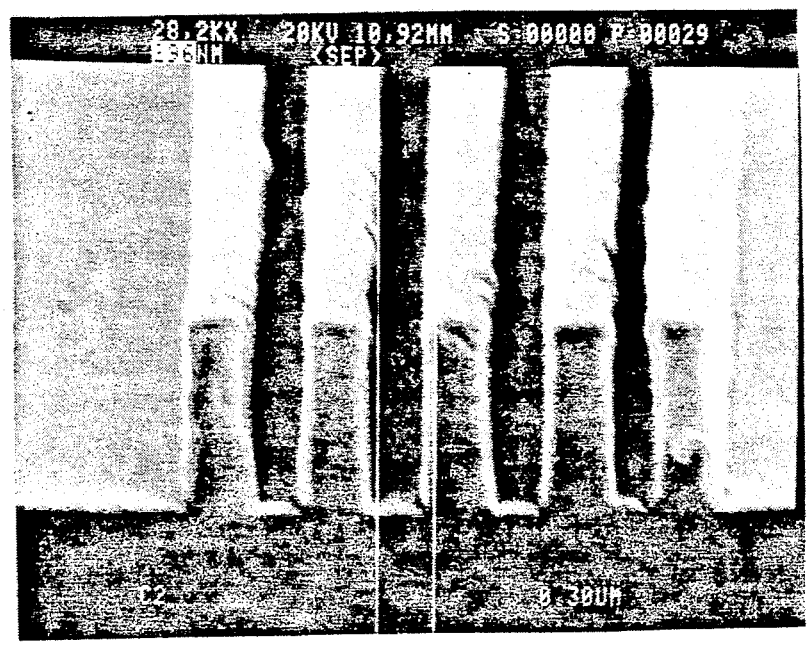
FIG. 6B is a photo micrograph showing 0.30 micrometer images.
Figure 7A:
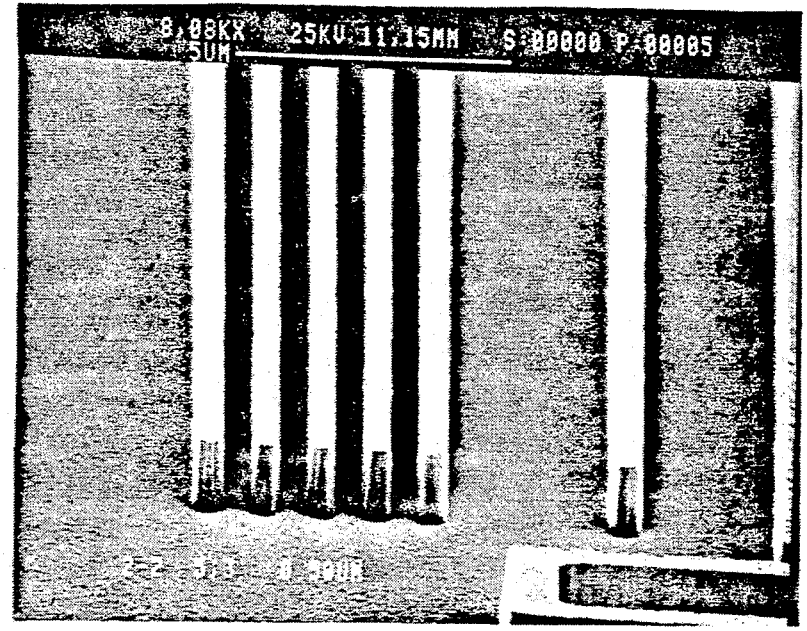
FIG. 7A is a photo micrograph showing 0.50 micrometer images.
Figure 7B:
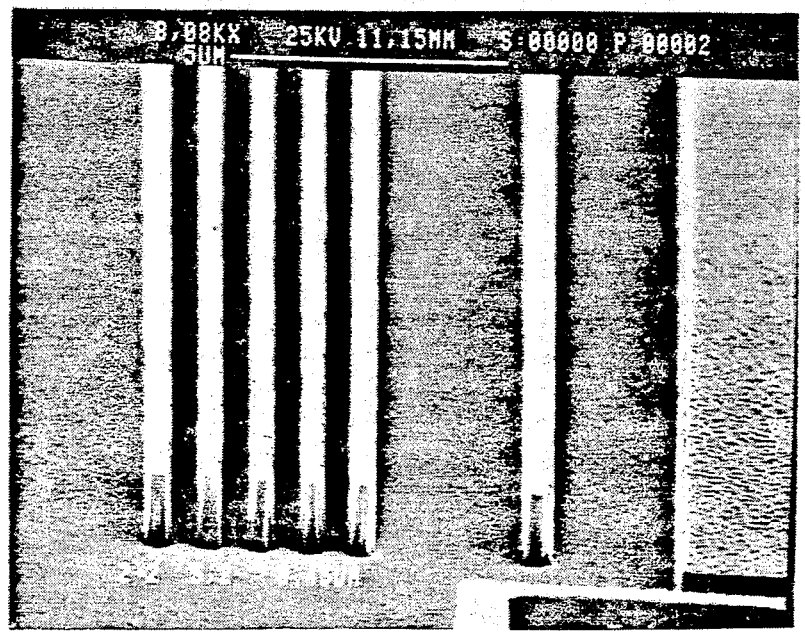
FIG. 7B is a photo micrograph showing 0.45 micrometer images.

This diacetate was compounded into a photoresist formulation such that there was 14.40% (w/w) poly(*p*-hydroxystyrene), 1.00% (wt/wt) 2,6-diacetoxymethyl-*p*-cresol, 1.15% (w/w) 9- anthracenemethanol, 81.99% (w/w) propylene glycol methyl ether acetate and 1.44% (w/w) MDT (trifluoromethylsulfonyloxy-bicyclo[2.2.1]-hept-5-ene-2,3-dicarboximide), the non-metallic sulfonic acid precursor of U.S. patent application Ser. No. 07/322,848 filed Mar. 14, 1989, the disclosure of which is incorporated into the present application. This photoresist formulation was spin coated onto silicon wafers to form a 1.1 μm thick coating. The coated wafers were baked at 90° C. for 1 minute and were then exposed with 4.0 mJ/cm² of 248 nm light using a 0.37 NA CANON excimer step and repeat tool. The wafers were post-exposed baked on a 110° C. hot-plate for 12 seconds. The wafers were then silylated for three minutes at 60° C. using 100 Torr dimethylaminotri- methylsilane in a MONARCH 150 single wafer silylation tool. The silylated wafers were etched in an Applied Materials AME5000 magnetically enhanced plasma etch tool. Etching conditions were as follows: 500 w RF power, 20 SCCM O₂, 50 mTorr, 60 Gauss for 90 seconds. Etch residue was removed from the wafers with a 10 second immersion in 7:1 BHF followed by a water rinse (FIG. 6). Imaging at 365 μm was also accomplished with this resist system using GCA 0.45NA step and repeat tool. A dose of 20 mJ/cm² was used for imaging (FIG. 7).

Although this invention has been described with respect to specific embodiments, the details thereof are not to be construed as limitations, for it will be apparent that various embodiments, changes and modifications may be resorted to without departing from the spirit and scope thereof, and it is understood that such equivalent embodiments are intended to be included within the scope of this invention.

We claim:

1. A process for generating a positive tone resist image on a substrate comprising the steps of:
   (a) coating the substrate with a radiation sensitive film comprising
      (i) a film-forming aromatic polymer resin having functional groups which increase the chemical reactivity of the resin towards electrophilic aromatic substitution,
      (ii) an acid catalyzable crosslinking agent comprising a carboxylate ester of a benzyl alcohol, which crosslinking agent forms an electron donating group stabilized benzyl carbonium ion upon reaction with acid, and
      (iii) a radiation degradable acid generator which forms an acid upon exposure of said radiation sensitive film to imaging radiation, such that, upon crosslinking, said composition is rendered selectively less permeable to the absorption of an organometallic reagent in the crosslinked regions than it is in the non-crosslinked regions;
   (b) imagewise exposing of the film to mid or deep UV radiation to cause crosslinking of the resin in the exposed portion of the film;
   (c) contacting said film with an organometallic reagent to absorb the organometallic agent in more permeable unexposed areas; and,
   (d) etching the film with reactive ions to yield a positive resist pattern.

2. The process of claim 1 wherein the organometallic reagent is in liquid or gaseous form.

3. The process of claim 2 wherein the organometallic reagent is selected from the group consisting of organosilicon, organotin, organogermanium and organotitanium compounds.

4. The process of claim 3 wherein the organometallic reagent is selected from the group consisting of dimethylaminotrimethylsilane, hexamethyldisilazane, trimethylsilyl chloride, trimethylstannyl chloride, and 1,1,3,3,5,5-hexamethylcyclotrisilazane.

5. The process of claim 1 wherein the functional groups of said aromatic polymer resin are phenolic hydroxy groups.

6. The process of claim 1 wherein the aromatic polymer resin is selected from the group consisting of poly(hydroxystyrene), poly(hydroxystyrene-co-t-butyloxycarbonyloxystyrene), poly(hydroxystyrene), poly(hydroxy-styrene-co-hydroxymethylstyrene), poly(hydroxystyrene-co-acetoxymethylstyrene), and novolak resin.

7. The process of claim 6 wherein the novolak resin is an alkylphenolformaldehyde condensation product.

8. The process of claim 7 wherein the alkylphenolformaldehyde condensation product is selected from the group consisting of cresol novolaks, ethylphenol novolaks, and xylenol novolaks.

9. The process of claim 1 wherein said acid catalyzable crosslinking agent which forms a benzyl carbonium ion upon reaction with acid is a polyfunctional monomer.

10. The process of claim 9 wherein said polyfunctional monomer is selected from the group consisting of 2,6-diacetoxymethyl-*p*- cresol, 2,6-diacetoxy phenol 2,2',6,6'tetraacetoxymethyl-Bisphenol A, and trisacetoxymesitylene.

11. The process of claim 1 wherein said acid catalyzable crosslinking agent which forms a benzyl carbonium ion upon reaction with acid is a polyfunctional polymer.

12. The process of claim 11 wherein said polyfunctional polymer selected from the group consisting of acetoxymethylstyrene and copolymers thereof.

13. The process of claim 12 wherein said polyfunctional polymer is a copolymer of *p*-hydroxystyrene and *p*-acetoxymethyl styrene where the molecular ratio of *p*-hydroxystyrene to *p*-acetoxymethyl styrene is about 4 to 1.

14. The process of claim 1 wherein the radiation degradable acid generator which is adapted to absorb imaging radiation is selected from the group consisting of metallic and nonmetallic onium salts and non-metallic sulfonic acid precursors which generate strong acids upon exposure to radiation.

15. The process of claim 14 wherein the onium salts are selected from the group consisting of diaryliodonium salts and triarylsulfonium salts.

16. The process of claim 15 wherein the diaryiodionium salts are selected from the group consisting of diaryliodonium hexafluoroarsenates, hexafluoroantimonates, and triflates.

17. The process of claim 16 wherein the diaryliodonium hexafluoroarsenates, hexafluoroantimonates, and triflates are selected from the group consisting of diphenyliodonium hexafluoroarsenate, di(t-butyl-phenyl)iodonium hexafluoroarsenate, diphenyliodonium hexafluoroantimonate, di(t-butyl- phenyl)iodonium hexafluoroantimonate, diphenyliodonium triflate, and di(t-butylphenyl)iodonium triflate.

18. The process of claim 15 wherein the triarylsulfonium salts are selected from the group consisting of trialkylsulfonium hexaafluoroantimonates, hexafluoroarsenates, hexafluorophosphates, and triflates.

19. The process of claim 18 wherein the trialkylsulfonium hexafluoroantimonates, hexafluoroarsenates, hexafluorophosphates, and triflates are selected from the group consisting of triphenylsulfonium hexafluoroantimonate, tri(t-butylphenyl) sulfonium hexafluoroantimonate, triphenylsulfonium hexafluoroarsenate, tri(t-butylphenyl)sulfonium hexafluoroarsenate, triphenylsulfonium hexafluorophosphate, tri(t-butylphenyl)sulfonium hexafluorophosphate, triphenylsulfonium triflate, and tri(t-butyl-phenyl)sulfonium triflate.

20. The process of claim 14 wherein the non-metallic sulfonic acid precursors are N-sulfonyloxyimides of the form

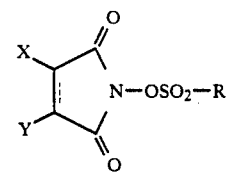

where R is selected from the group consisting of —$CF_3$, —$CF_2CF_3$, —$CF_2CF_2H$, —$(CF_2)_n$—Z where n=1 to 4, where Z is H, alkyl, aryl,

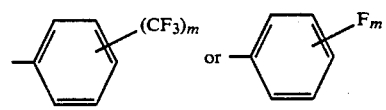

where m=1 to 5, where X and Y either (1) form a cyclic or polycyclic ring which may contain one or more hetero atoms, (2) form a fused aromatic ring, (3) may be independently H, alkyl or aryl, (4) may be attached to another sulfonyloxyimide-containing residue, or (5) may be attached to a polymeric chain or backbone.

21. The process of claim 1 which further includes an effective amount of an aromatic dye to absorb substantially all imaging electromagnetic radiation incident on said film during imaging.

22. The process of claim 21 wherein said aromatic dye is selected from the group consisting of nitrostilbene, substituted anthracenes, and substituted biphenyls.

23. The process of claim 22 wherein said anthracene is selected from the group consisting of phenoxymethyl anthracene, anthracene methanol, 9,10-diphenyl-anthracene, and phenanthracene.

* * * * *